United States Patent
Lee (10) Patent No.: US 7,245,149 B2
(45) Date of Patent: Jul. 17, 2007

(54) DYNAMIC PROGRAMMABLE LOGIC ARRAY HAVING ENABLE UNIT

(75) Inventor: Dong-Gyu Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 139 days.

(21) Appl. No.: 11/102,161

(22) Filed: Apr. 8, 2005

(65) Prior Publication Data

US 2005/0264317 A1    Dec. 1, 2005

(30) Foreign Application Priority Data

May 29, 2004  (KR) .................. 10-2004-0038708

(51) Int. Cl.
    *G06F 7/38*        (2006.01)
(52) U.S. Cl. .............................. 326/39; 326/37; 326/41
(58) Field of Classification Search ............ 326/44–45, 326/49–50, 37, 39–41, 47
    See application file for complete search history.

(56) References Cited

U.S. PATENT DOCUMENTS

| 5,083,047 A | 1/1992 | Horie et al. ................. 307/465 |
| 5,412,785 A * | 5/1995 | Skruhak et al. .............. 712/230 |
| 5,511,173 A * | 4/1996 | Yamaura et al. ............. 712/248 |
| 5,719,505 A | 2/1998 | Ditlow et al. .................. 326/39 |

OTHER PUBLICATIONS

Korean Patent Application No. 1019990063775 to Choi, having Publication date of Jul. 7, 2001 (w/ English Abstract page).
Korean Patent Application No. 1020020047229 to Lee, having Publication date of Feb. 14, 2004 (w/ English Abstract page).
Korean Patent Application No. 10-1996-0010748 having Publication date of Nov. 21, 1996 (w/ English Abstract page).
Korean Patent Application No. 05-242888 having Publication date of Apr. 24, 1995 (w/ English Abstract page).

* cited by examiner

*Primary Examiner*—Anh Q. Tran
(74) *Attorney, Agent, or Firm*—Monica H. Choi (57) ABSTRACT

A DPLA (dynamic programmable logic array) uses an enable unit for each output line that provides OR-functionality, to eliminate a clock signal in the OR-plane. A clock signal is used only in the AND-plane for pre-charging the product term lines. Such a DPLA operates properly without a delay constraint between clock signals in both the AND-plane and the OR-plane for proper operation at higher frequencies.

25 Claims, 8 Drawing Sheets

| CLK | Px | Py | Pz | Pi | OUT |
|---|---|---|---|---|---|
| 0 (Precharge) | 1 | 1 | 1 | 1 | 1 |
| 1 (Evaluation) | 1 | 1 | 1 | Don't Care | 1 |
| | 1 | 1 | 0 | Don't Care | 1 |
| | 1 | 0 | 1 | Don't Care | 1 |
| | 1 | 0 | 0 | Don't Care | 1 |
| | 0 | 1 | 1 | Don't Care | 1 |
| | 0 | 1 | 0 | Don't Care | 1 |
| | 0 | 0 | 1 | Don't Care | 1 |
| | 0 | 0 | 0 | 1 or 0 | Pi |

DYNAMIC PROGRAMMABLE LOGIC ARRAY HAVING ENABLE UNIT

CROSS-REFERENCE TO RELATED APPLICATION(S)

The present application claims priority under 35 U.S.C. §119 to Korean Patent Application No. 2004-0038708, filed on May 29, 2004, which is incorporated herein by reference in its entirety.

TECHNICAL FIELD

The present invention relates generally to dynamic programmable logic arrays (DPLA's), and more particularly, to a DPLA having enable unit(s) in the OR-plane such that a clock signal is not used in the OR-plane.

BACKGROUND OF THE INVENTION

A PLA (programmable logic array) is commonly known as flexibly providing a sum of products function of input signals. A PLA typically includes an AND-plane and an OR-plane for providing the sum of products. A DPLA (dynamic programmable logic array) also includes clock signals for controlling timing of operation of the DPLA.

Figure 1:
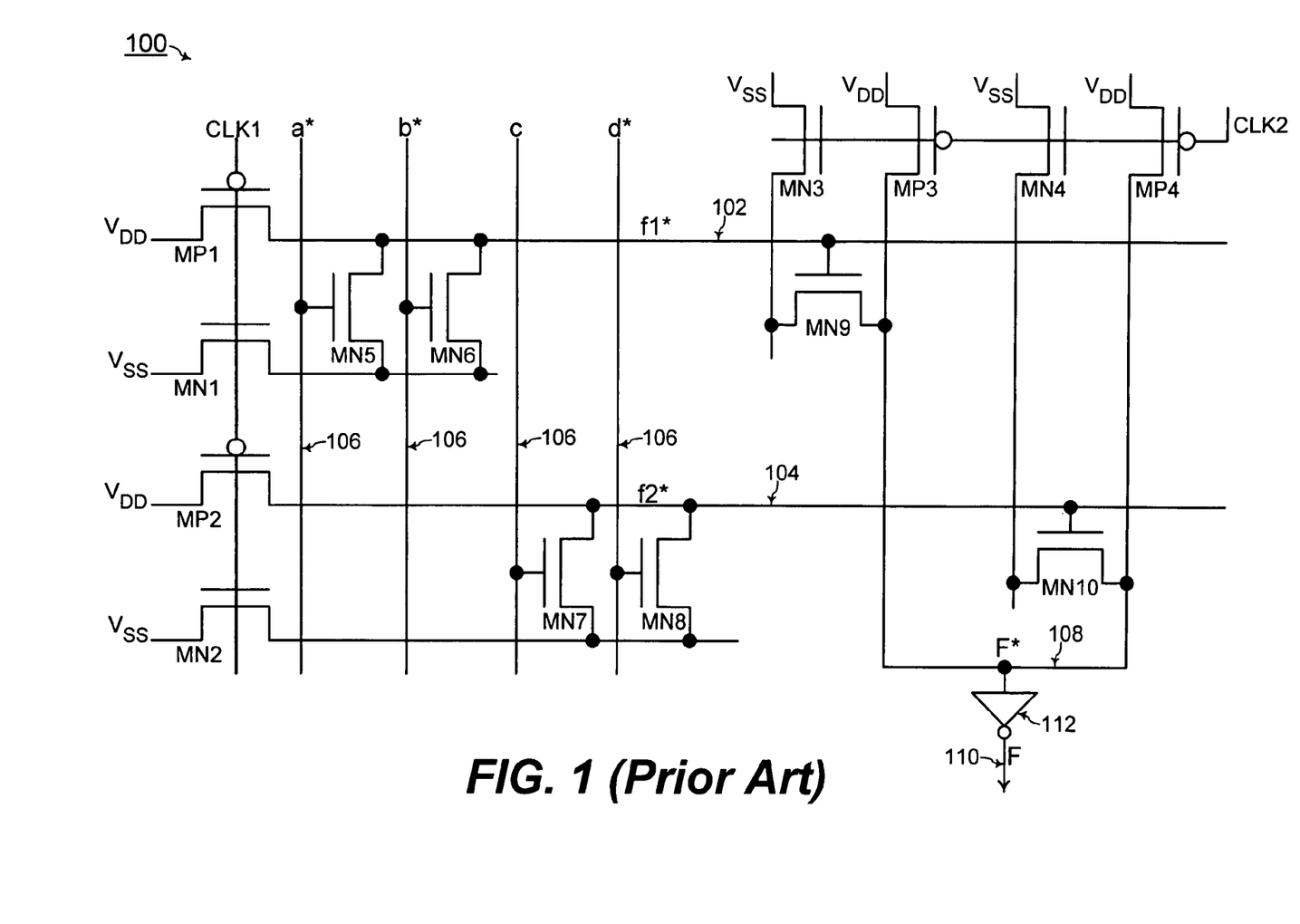
FIG. 1 shows a circuit diagram of an example DPLA (dynamic programmable logic array), according to the prior art.

FIG. 1 shows a conventional DPLA 100 using a first clock signal CLK1 for an AND-plane and a second clock signal CLK2 for an OR-plane. The AND-plane includes first and second product term lines, 102 and 104 respectively, having product terms, f1* and f2* respectively, generated thereon. Four inputs, a*, b*, c, and d* are applied on four input lines 106 as illustrated in FIG. 1. (Note that "*" herein refers to a complement of a signal as commonly known to one of ordinary skill in the art).

CLK1 is coupled to the gates of a first PMOSFET MP1 and a first NMOSFET MN1 that are coupled to high and low voltages, $V_{DD}$ and $V_{SS}$ respectively, for charging/discharging the first product term line 102 depending on a logical state of CLK1. CLK1 is also coupled to the gates of a second PMOSFET MP2 and a second NMOSFET MN2 that are coupled to $V_{DD}$ and $V_{SS}$ respectively for charging/discharging the second product term line 104 depending on the logical state of CLK1.

When CLK1 is a logical low state (i.e., "0") during a pre-charge time, the product term lines 102 and 104 are each pre-charged to a logical high state (i.e., "1"). Because of the connections of NMOSFETs MN5, MN6, MN7, and MN8 in the AND-plane of FIG. 1, when CLK1 is a logical high state during an evaluation time, the respective logical state of each of f1* and f2* on the product term lines 102 and 104 depends on the logical states of the inputs, a*, b*, c, and d*, as follows:

$$f1^* = a \times b$$

$$f2^* = c^* \times d$$

(Note that "x" herein refers to an AND operation, and "+" herein refers to an OR operation, as commonly known to one of ordinary skill in the art.)

Further referring to FIG. 1, CLK2 is coupled to the gates of a third NMOSFET MN3, a third PMOSFET MP3, a fourth NMOSFET MN4, and a fourth PMOSFET MP4. The PMOSFETs MP3 and MP4 are coupled to $V_{DD}$, and the NMOSFETs MN3 and MN4 are coupled to $V_{SS}$. When CLK2 is a logical low state during a pre-charge time, a pre-output line 108 having a signal F* generated thereon is pre-charged to a logical high state. An output line 110 having a signal F generated thereon is coupled to the pre-output line 108 via an inverter 112.

Because of the connections of NMOSFETs MN9 and MN10 in the OR-plane of FIG. 1, when CLK2 is a logical high state during an evaluation time, the respective logical state of F depends on the logical states of f1* and f2* and thus of the inputs, a*, b*, c, and d*, as follows:

$$F^* = f1 \times f2$$

$$F = f1^* + f2^* = (a \times b) + (c^* \times d)$$

Thus, the output line 110 provides an OR-function of the product terms f1* and f2*.

Figure 2:
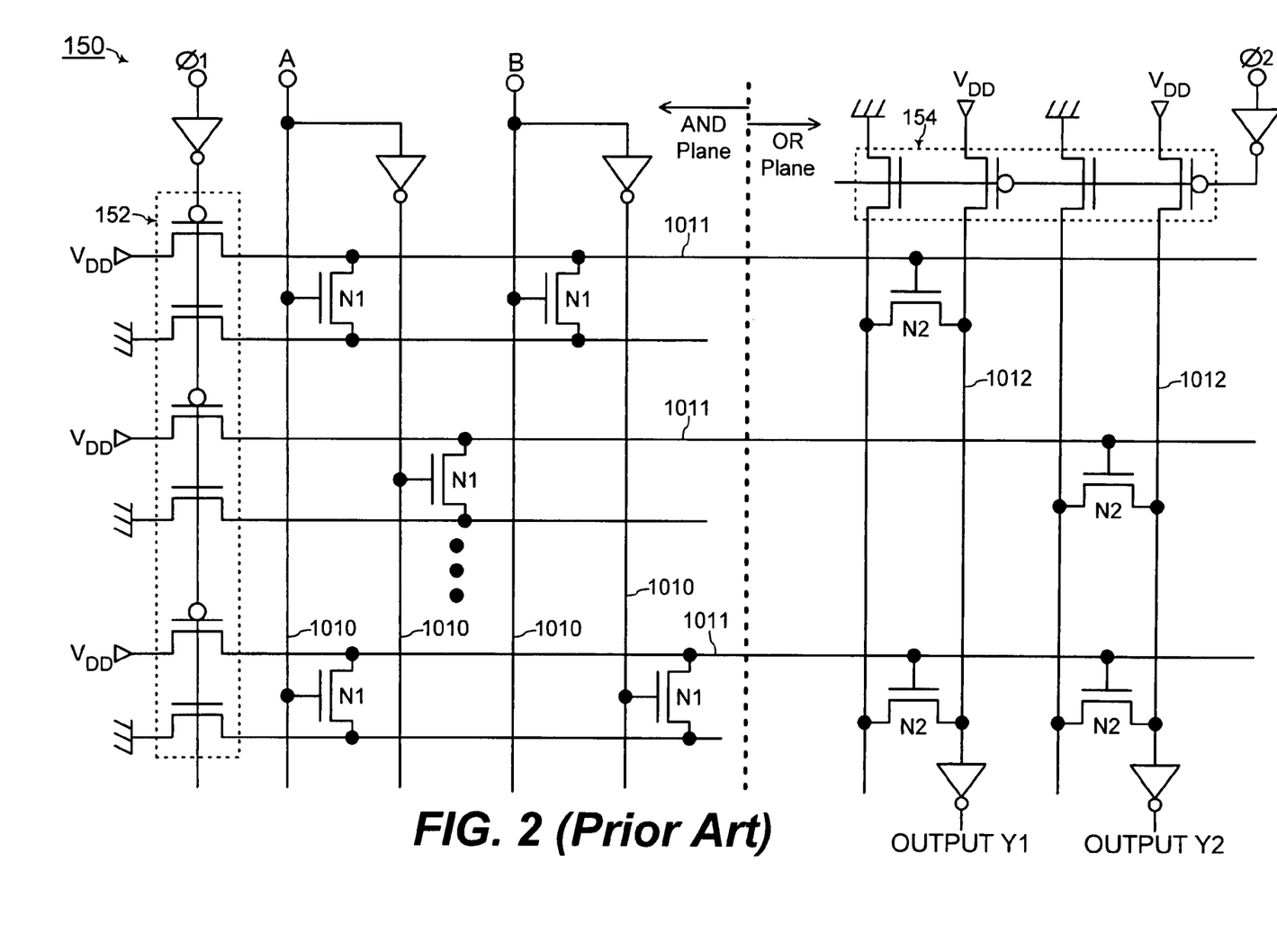
FIG. 2 shows a circuit diagram of another example DPLA (dynamic programmable logic array), according to the prior art.
Figure 3:
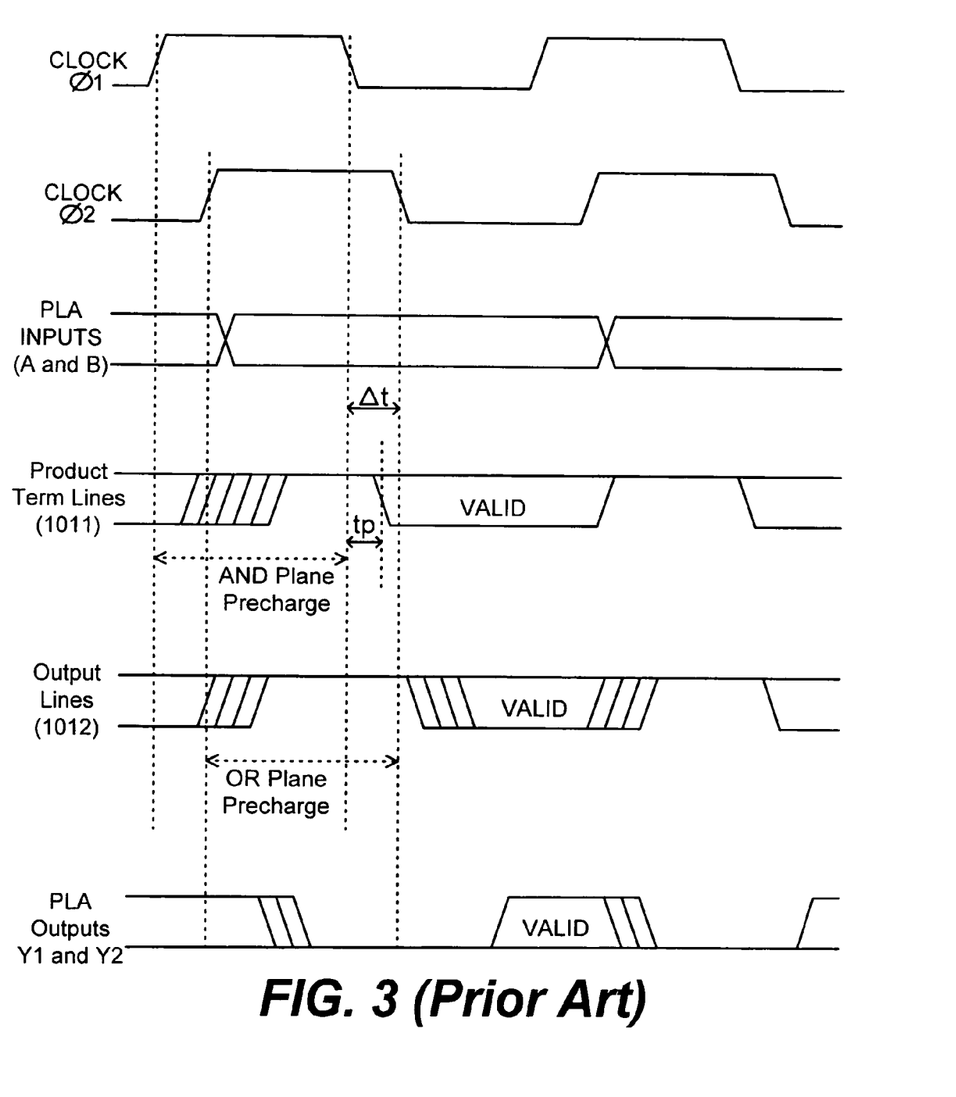
FIG. 3 shows a timing diagram of signals during operation of the DPLA of FIG. 2, according to the prior art.

FIG. 2 shows a DPLA (dynamic programmable logic array) 150, and FIG. 3 shows a timing diagram during operation of the DPLA 150 of FIG. 2, as disclosed in U.S. Pat. No. 5,083,047 to Horie et al. The AND-plane of the DPLA 150 generates product terms on product term lines 1011 from inputs A, A*, B, and B* on input lines 1010. The OR-plane of the DPLA 150 generates outputs, Y1 and Y2, via output lines 1012.

Referring to FIGS. 2 and 3, the DPLA 150 includes a first clock signal Ø1 for the AND-plane and a second clock signal Ø2 for the OR-plane. A first group of PMOSFETs and NMOSFETs 152 are coupled to $V_{DD}$ and a ground node and receive Ø1 for charging/discharging the product term lines 1011 depending on the logical state of Ø1. A second group of PMOSFETs and NMOSFETs 154 are coupled to $V_{DD}$ and the ground node and receive Ø2 for charging/discharging the output lines 1012 depending on the logical state of Ø2.

The connections of NMOSFETs N1 determine a respective product term on each of the product term lines 1011 as an AND-function of a respective set of inputs. The connections of the NMOSFETs N2 determine an OR-function of a respective set of product terms for each of the output lines 1012.

Referring to FIGS. 2 and 3, when Ø1 is a logical high state during an AND-plane pre-charge time, each of the product term lines 1011 is pre-charged to a logical high state. When Ø2 is a logical high state during an OR-plane pre-charge time, each of the output lines 1012 is pre-charged to a logical high state. When Ø1 turns to a logical low state for an AND-plane evaluation time, the respective logical state for each of the product term lines 1011 becomes valid after a propagation delay tp from when Ø1 turns to the logical low state.

Further referring to FIG. 3, Ø2 for the OR-plane is delayed from Ø1 for the AND-plane by Δt to ensure that the product terms are valid before generating the OR-function of such product terms on the output lines 1012. Thus, Δt is desired to be greater than tp to ensure proper operation of the prior art DPLA 150.

On the other hand, the DPLA 150 is also desired to operate with ever faster speed with Ø1 and Ø2 having higher frequency. With such higher frequency of Ø1 and Ø2, the delay relationship of Δt>tp is more difficult to maintain since Δt cannot be easily controlled with the higher frequency of Ø1 and Ø2. In addition, tp is difficult to control as the propagation delay through the AND-plane.

As an unfortunate result, with higher frequency of Ø1 and Ø2, the DPLA 150 may not operate properly because of the delay constraint between Ø1 and Ø2. Thus, a DPLA (dynamic programmable logic array) without such a delay constraint between the two clock signals Ø1 and Ø2 of the AND-plane and the OR-plane is desired such that the DPLA may properly operate even at higher frequency.

SUMMARY OF THE INVENTION

Accordingly, a DPLA (dynamic programmable logic array) of the present invention uses an enable unit for each output line providing an OR-functionality to eliminate a clock signal in the OR-plane.

In a general aspect of the present invention, for performing a logic function on a plurality of inputs to generate an output, a respective switching device receives a respective input for each of a first subset of the inputs to set the output to a first output logical state if the respective input is a first input logical state. In addition, an enable unit receives a second subset of the inputs to set the output to the first output logical state if any input of the second subset is the first input logical state. The enable unit determines a logical state of the output from the second subset of inputs when every input of the first subset is a second input logical state.

In one embodiment of the present invention, the enable unit is an enable circuit including a first switching device that turns on to couple a first voltage source to an output line for setting the output to the first output logical state. In addition, the enable circuit includes a second switching device that turns on to couple a second voltage source to the output line for setting the output to the second output logical state. Furthermore, the enable circuit includes at least one logic gate for determining which of the first and second switches to turn on from the second subset of the inputs.

In another embodiment of the present invention, the first subset and the second subset are mutually exclusive sets of the inputs, and the first subset and the second subset comprise all of the inputs. In a further embodiment of the present invention, the second subset consists of just one of the inputs that is not part of the first subset.

In an example embodiment of the present invention, the logic function is an OR function. In that case, the first input and output logical states are each a high logical state, and the second input and output logical states are each a low logical state.

The present invention may be used to particular advantage when the output is generated at an output line of a dynamic PLA (programmable logic array). In that case, each of the inputs is a respective product term from a corresponding product term line of the dynamic PLA.

In one example embodiment of such a DPLA, each product term line is pre-charged to set the output to the first output logical state during a pre-charge time of an AND-plane clock signal. In that case, the enable unit and each respective switching device determine a logical state of the output from the inputs during an evaluation time of the AND-plane clock signal.

Thus, the output line is not pre-charged with any OR-plane clock signal, and the output line is not coupled to any OR-plane clock signal. In this manner, the DPLA of the present invention includes a clock signal only within the AND-plane without any clock signal in the OR-plane. Instead of a clock signal, the enable unit determines the logical state of the OR-function output. Such a DPLA without a clock signal in the OR-plane operates properly without any delay constraint between clock signals in both the AND-plane and the OR-plane of the prior art. Thus, the DPLA of the present invention may operate properly for higher frequencies than in the prior art.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8A, and 8B refer to elements having similar structure and function.

DETAILED DESCRIPTION

Figure 4:
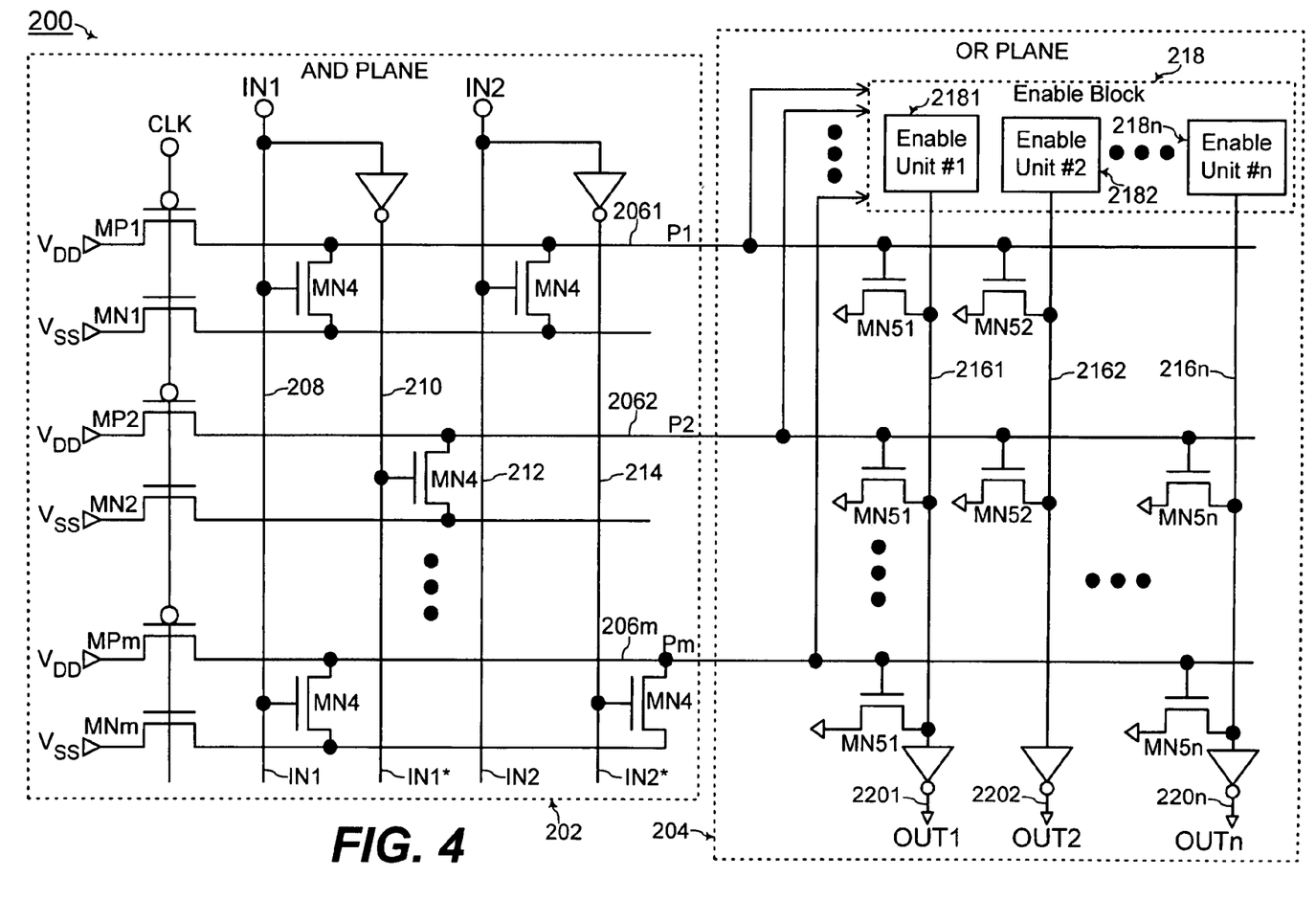
FIG. 4 shows a circuit diagram of a DPLA (dynamic programmable logic array) having enable units instead of a clock signal in the OR-plane, according to an embodiment of the present invention.

Referring to FIG. 4, a DPLA (dynamic programmable logic array) 200 of the present invention includes an AND-plane 202 and an OR-plane 204. The AND-plane 202 generates a respective product term P1, P2, and so on to Pm on each of "m" product lines 2061, 2062, and so on to 206m, respectively, that is a product term of a respective set of the inputs IN1, IN1*, IN2, and IN2* on input lines 208, 210, 212, and 214, respectively.

A respective pair of a PMOSFET and an NMOSFET is coupled to each product term line and to high and low voltage sources, $V_{DD}$ and $V_{SS}$ respectively, to charge/discharge the product term line. A first PMOSFET MP1 and a first NMOSFET MN1 are coupled to the first product term line 2061; a second PMOSFET MP2 and a second NMOSFET MN2 are coupled to the second product term line 2062; and so on such that an mth PMOSFET MPm and an mth NMOSFET MNm are coupled to the mth product term line 206m.

Each of the PMOSFETs MP1, MP2, and so on to MPm is coupled to the high voltage $V_{DD}$, and each of the NMOSFETs MN1, MN2, and so on to MNm is coupled to the low voltage $V_{SS}$. The gates of such PMOSFETs and NMOSFETs are coupled to an AND-plane clock signal, CLK.

When CLK is a logical low state for a pre-charge time, each of the product term lines 2061, 2062, and so on to 206m is pre-charged to a logical high state. Alternatively when CLK is a logical high state for an evaluation time, because of the connections of NMOSFETs MN4 in the AND-plane 202 of FIG. 4, each of the product term lines 2061, 2062, and so on to 206m provides a respective product term of a respective set of the inputs IN1, IN1*, IN2, and IN2*. For example during such an evaluation time:

$P1=IN1^* \times IN2^*$ $P2=IN1$ $Pm=IN1^* \times IN2$

The OR-plane 204 includes a plurality of pre-output lines 2161, 2162, and so on to 216n coupled to a respective inverter to generate a respective output OUT1, OUT2, and so on to OUTn on a respective output line 2201, 2202, and so on to 220n. In addition, each of the pre-output lines 2161, 2162, and so on to 216n is coupled to a respective enable unit 2181, 2182, and so on to 218n within an enable block 218.

Furthermore, each of the pre-output lines 2161, 2162, and so on to 216n is coupled to a respective set of at least one NMOSFET. Thus, a first set of NMOSFETs MN51 is coupled to the first pre-output line 2161, a second set of NMOSFETs MN52 is coupled to the second pre-output line 2162, and an nth set of NMOSFETs MN5n is coupled to the nth pre-output line 216n. Because of the connections of such NMOSFETs MN51, MN52, and so on to MN5n, the outputs OUT1, OUT2, and so on to OUTn each provide the OR-functionality of a respective set of product terms as follows:

$OUT1=P1+P2+Pm$ $OUT2=P1+P2$ $OUT3=P2+Pm$

Figure 5:
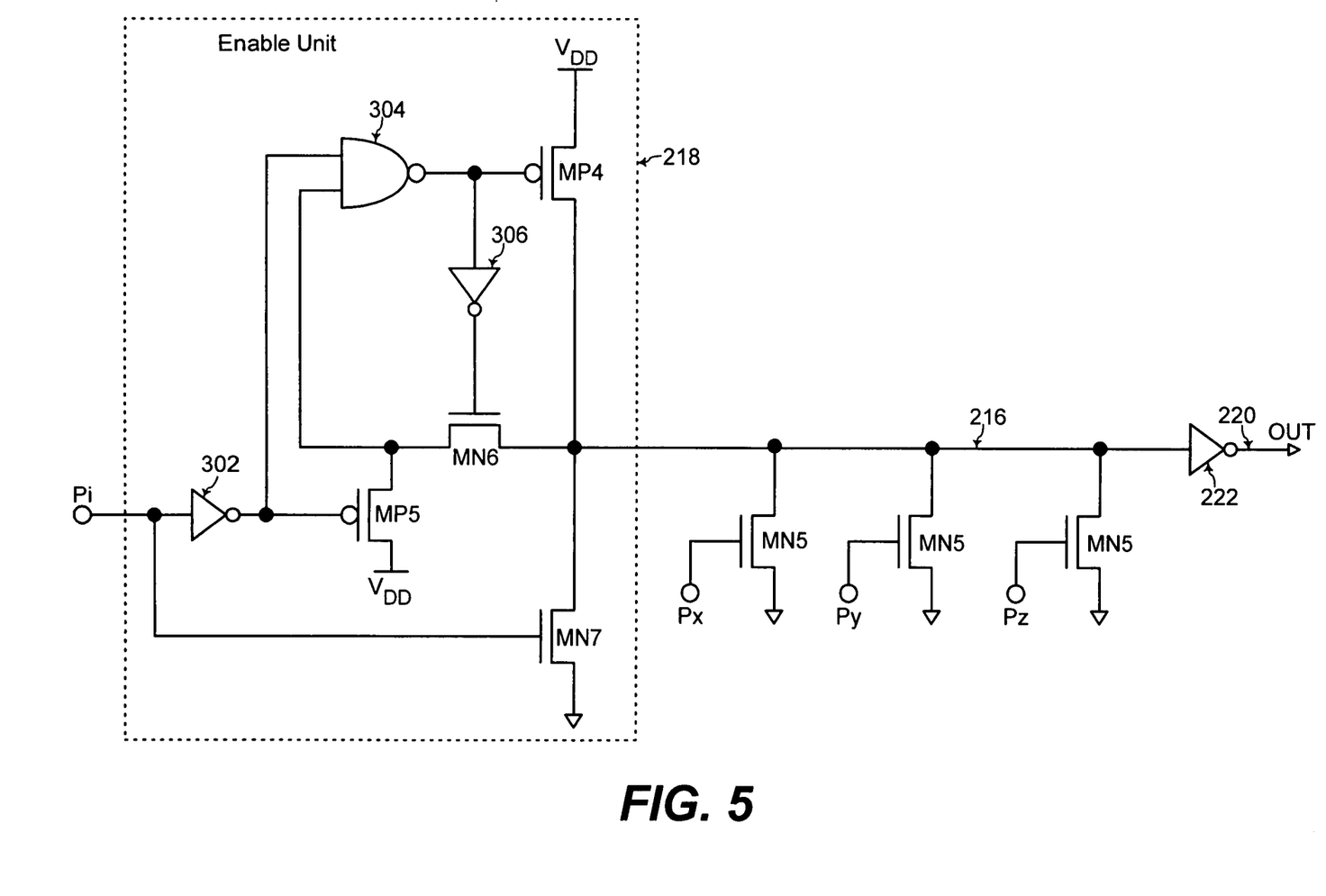
FIG. 5 shows a circuit diagram of an example enable unit for an example output line in the DPLA of FIG. 4, according to an embodiment of the present invention.

FIG. 5 shows an example embodiment of an enable unit 218 for a pre-output line 216 that generates an output OUT on an output line 220. Such an implementation may be for any one of the enable units 2181, 2182, and so on to 218n with a respective one of the pre-output lines 2161, 2162, and so on to 216n.

Referring to FIG. 5, assume that the output OUT on the output line 220 provides an OR-functionality for a respective set of product terms Pi, Px, Py, and Pz from the AND-plane 202 as follows:

$OUT=Pi+Px+Py+Pz$

For the enable unit 218 of the present invention, one of the product terms (Pi in the example of FIG. 5) is coupled to be received by the enable unit 218. Each of the remaining product terms Px, Py, and Pz is coupled to a gate of a respective one of the NMOSFETs MN5, each having a source coupled to the ground node and each having a drain coupled to the pre-output line 216. The output line 220 is coupled to the pre-output line 216 through an inverter 222. In addition, each of the product terms Pi, Px, Py, and Pz is a distinct product term from a respective one of the product term lines 2061, 2062, and so on to 206m, different for each of the product terms Pi, Px, Py, and Pz.

Further referring to FIG. 5, the enable unit 218 includes a first inverter 302 having an input that receives Pi and having an output coupled to an input of a NAND gate 304 and to a gate of a first PMOSFET MP5. The PMOSFET MP5 has a source coupled to a high voltage source VDD and a drain coupled to an input of the NAND gate 304 and a source of a first NMOSFET MN6.

The output of the NAND gate 304 is coupled to a gate of a second PMOSFET MP4 and to an input of a second inverter 306. The second PMOSFET MP4 has a source coupled to the high voltage source VDD and a drain coupled to drains of a second NMOSFET MN7 and the first NMOSFET MN6. The output of the second inverter 306 is coupled to a gate of the first NMOSFET MN6. Pi is also coupled to a gate of the second NMOSFET MN7.

Figure 6:
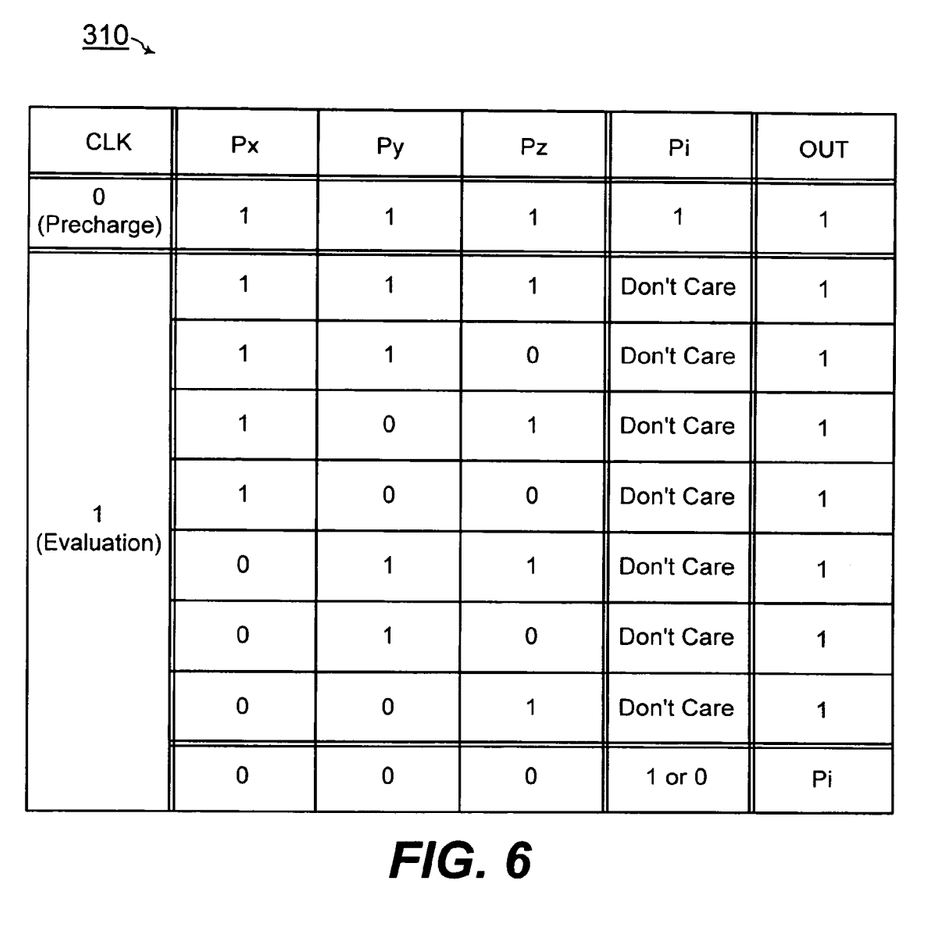
FIG. 6 shows a table of logical states for signals in the circuit diagram of FIG. 5, according to an embodiment of the present invention.

FIG. 6 shows a table 310 of logical states during operation of the enable unit 218 with the output line 220 of FIG. 5. In the table 310 of FIG. 6, "1" refers to a logical high state, and "0" refers to a logical low state. In addition, the output signal OUT has an output logical state, and each of the product terms Pi, Px, Py, and Pz each has an input logical state.

Referring to FIGS. 4, 5, and 6, when the clock signal CLK is a logical low state during a pre-charge time, each of the product terms Pi, Px, Py, and Pz has a high input logical state. Thus, the output signal OUT has a high output logical state during such a pre-charge time.

When the clock signal CLK is a logical high state during an evaluation time, the table 310 of FIG. 6 illustrates the eight possible combinations of the logical states of the product term inputs Px, Py, and Pz coupled to the NMOSFETs MN5. If any of such product term inputs Px, Py, and Pz has a high input logical state, then the output signal OUT has the high output logical state irrespective of the input logical state of the product term Pi received by the enable unit 218. When any of the product term inputs Px, Py, and Pz has the high input logical state, at least one of the NMOSFETs MN5 is turned on such that the output signal OUT has the high output logical state irrespective of the input logical state of Pi.

On the other hand, if all of the product term inputs Px, Py, and Pz coupled to the NMOSFETs MN5 has a low input logical state, the output logical state of the output signal OUT is determined by the input logical state of Pi received by the enable unit 218. When all of the product term inputs Px, Py, and Pz have the low input logical state, all of the NMOSFETs MN5 are turned off such that the output of the enable unit 218 determines the output logical state of the output signal OUT.

In that case, if Pi has a high input logical state, the output signal OUT has a high output logical state as the second NMOSFET MN7 is turned on to couple the low voltage of the ground node to the pre-output line 216. On the other hand, if Pi has a low input logical state, the output signal OUT has a low output logical state as the second PMOSFET MP4 is turned on to couple the high voltage $V_{DD}$ to the pre-output line 216.

Thus, when all of the product term inputs Px, Py, and Pz has the low input logical state, the output logical state of the output signal OUT is the input logical state of Pi. In this manner, when all of the product term inputs Px, Py, and Pz have the low input logical state, the logic gates 302, 304, and 306 control the switching devices MN4 and MN7 depending on the input logical state of Pi for determining the output logical state of the output signal OUT.

Referring to FIGS. 4 and 5, each of the enable units 2181, 2182, and so on to 218n is implemented similarly as the enable unit 218 of FIG. 5. The respective output OUT1, OUT2, and so on to OUTn provides an OR-functionality of a respective set of product terms. For each of the enable units 2181, 2182, and so on to 218n, one product term of the respective set of product terms is coupled to the enable unit while the remaining product terms of the respective set are each coupled to a respective one of the respective set of NMOSFETs MN51, MN52, . . . , or MN5n.

In one example embodiment of the present invention, a respective product term coupled to each of the enable units 2181, 2182, and so on to 218n is different from each-other for minimizing connectivity length. However, the present invention may be generally practiced with any product term of the respective set of product terms being coupled to each of the enable units 2181, 2182, and so on to 218n.

Figure 7:
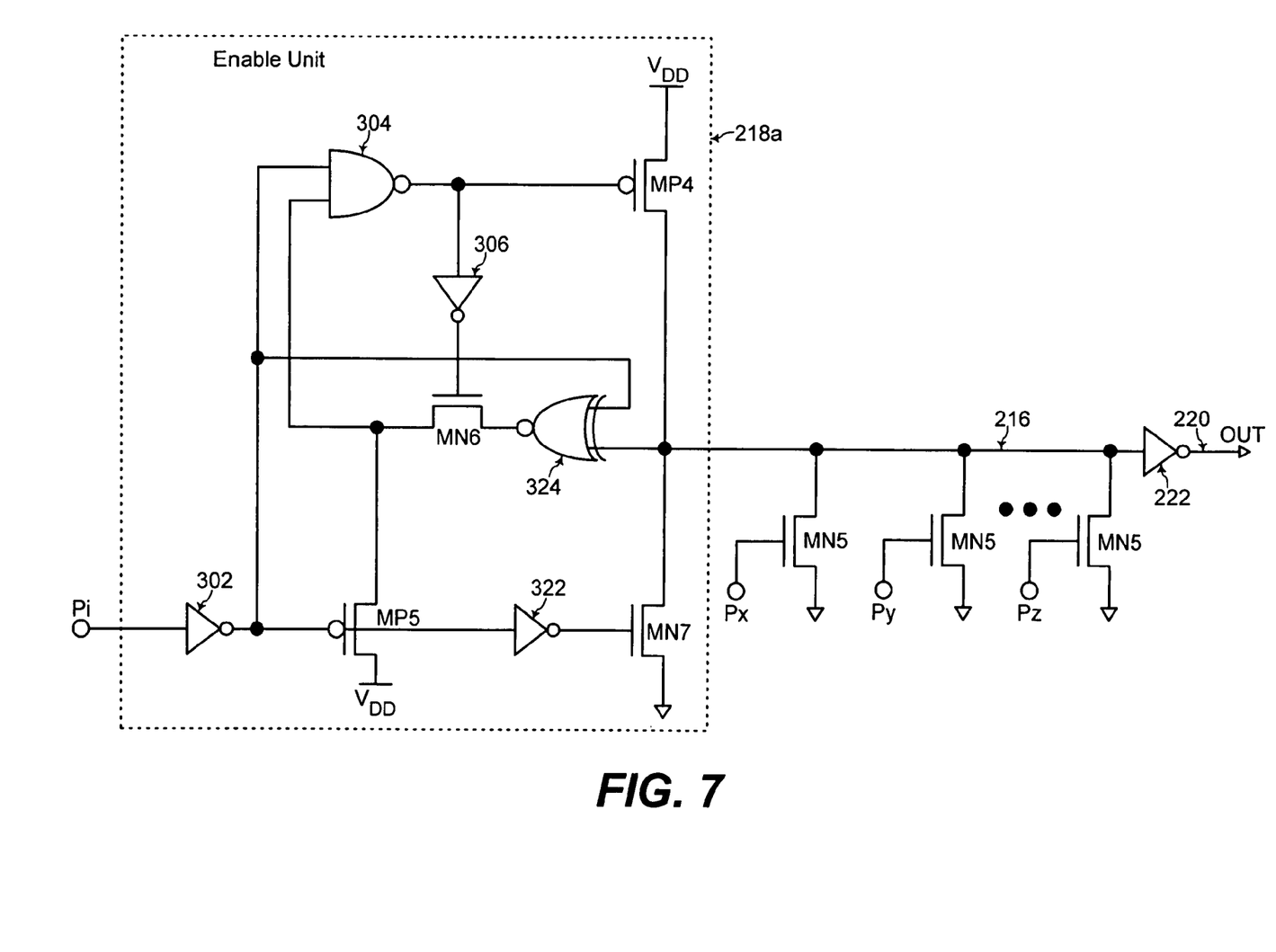
FIG. 7 shows a circuit diagram of another example enable unit for an example output line in the DPLA of FIG. 4, according to an alternative embodiment of the present invention.

In addition, the present invention may be practiced with other implementations for the enable unit 218. FIG. 7 illustrates an alternative enable unit 218a different from the enable unit 218 of FIG. 5. Referring to FIG. 7, the enable unit 218a further includes a third inverter 322 and an exclusive NOR gate 324. The third inverter 322 has an input coupled to the gate of the first PMOSFET MP5 and has an output coupled to the gate of the second NMOSFET MN7.

The exclusive NOR gate 324 has inputs coupled to the output of the first inverter 302 and the pre-output node 216 and has an output coupled to the drain of the first NMOSFET MN6. The enable unit 218a and the NMOSFETs MN5 in FIG. 7 operate identically with the enable unit 218 and the NMOSFETs MN5 in FIG. 5, according to the table 310 of FIG. 6.

Figure 8A:
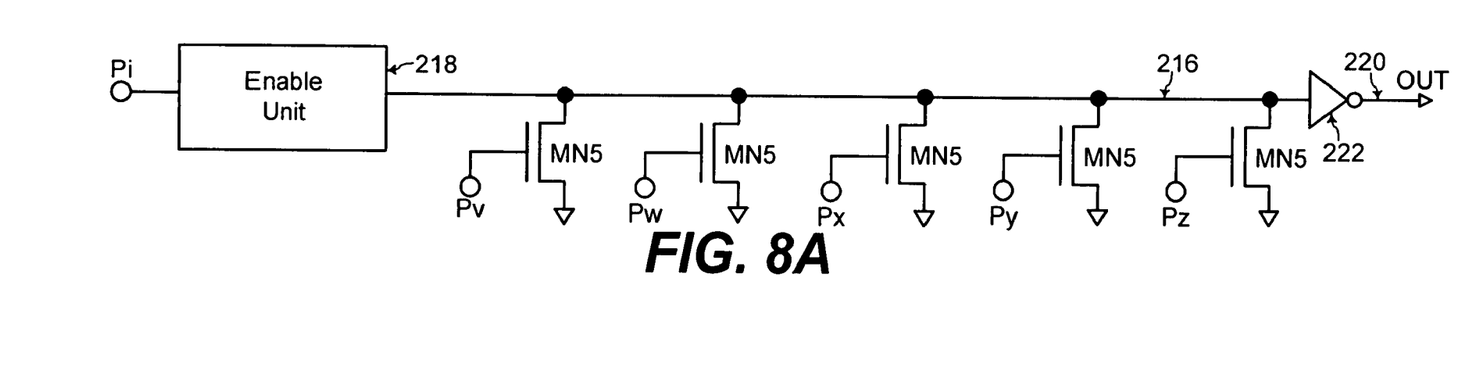
FIGS. 8A and 8B illustrate an equivalent implementation using two enable units instead of one enable unit for a same output line, according to an alternative embodiment of the present invention.
Figure 8B:
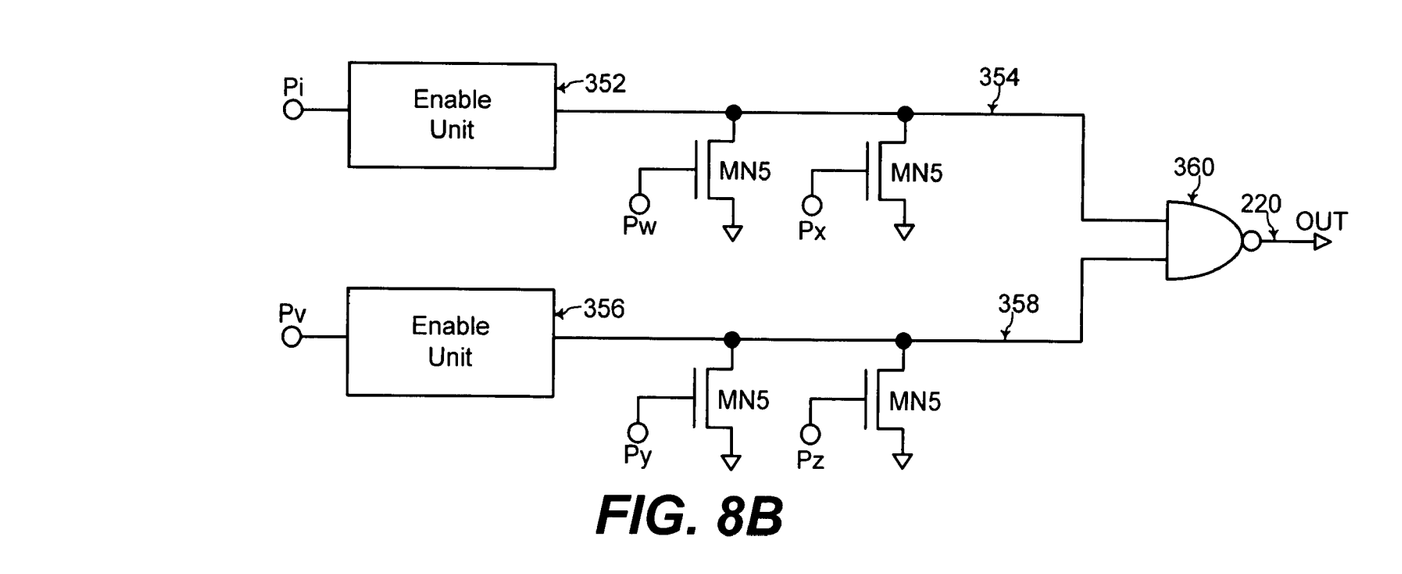

FIGS. 8A and 8B illustrate another embodiment of the present invention for generating an output signal OUT using one enable unit 218 in FIG. 8A and two enable units 218b and 218c in FIG. 8B. In both FIGS. 8A and 8B, the output signal OUT provides an OR-functionality of the product terms Pi, Pv, Pw, Px, Py, and Pz as follows:

OUT=$Pi+Pv+Pw+Px+Py+Pz$

FIG. 8A is similar to FIG. 5 with one product term Pi being coupled to the enable unit 218 and with each of the remaining product terms Pv, Pw, Px, Py, and Pz being coupled to the gate of a respective one of the NMOSFETs MN5. Referring to FIG. 8B, a first enable unit 352 receives one product term Pi and is coupled to a first pre-output line 354. Each of two remaining output terms, Pw and Px, is coupled to the gate of a respective one of the NMOSFETs MN5 coupled to the first pre-output line 354.

Further referring to FIG. 8B, a second enable unit 356 receives another remaining output term Pv and is coupled to a second pre-output line 358. Each of two remaining output terms, Py and Pz, is coupled to the gate of a respective one of the NMOSFETs MN5 coupled to the second pre-output line 358. The first and second pre-output lines 354 and 358 are coupled as inputs of a NAND gate 360 that generates the output signal OUT on the output line 220.

The output signal OUT generated in FIGS. 8A and 8B are equivalent and provide an OR-functionality of the product terms Pi, Pv, Pw, Px, Py, and Pz as follows:

OUT=$Pi+Pv+Pw+Px+Py+Pz$

Each of the enable units 218, 352, and 356 of FIGS. 8A and 8B may be implemented similarly as the enable unit in FIG. 5 or FIG. 7.

In this manner, the DPLA 200 of the present invention includes a clock signal CLK only within the AND-plane 202 without any clock signal in the OR-plane 204. Instead of a clock signal, each of the enable units 2181, 2182, and so on to 218n determines the respective output logical state of the OR-function outputs, OUT1, OUT2, and so on to OUTn, respectively. Such a DPLA 200 without a clock signal in the OR-plane 204 operates properly without a delay constraint between clock signals in both the AND-plane 202 and the OR-plane 204. Thus, the DPLA 200 of the present invention may operate properly for higher frequencies than in the prior art.

The foregoing is by way of example only and is not intended to be limiting. For example, MOSFETs of FIGS. 4, 5, 7, 8A, and 8B are example switching devices, and the present invention may also be implemented with other types of switching devices. In addition, any numbers used herein such as the number of product terms for each output line of the OR-plane is by way of example only.

Furthermore, the OR-functionality provided by the enable unit(s) in FIGS. 5, 7, 8A, and 8B may be used for other applications aside from the example of the OR-plane of the DPLA 200 with other types of inputs aside from the example of product terms from the AND-plane of the DPLA 200. In addition, the present invention may be generalized to coupling a first subset of at least one inputs to the enable unit and a second subset of at least one inputs to the NMOSFETs MN5.

The present invention is limited only as defined in the following claims and equivalents thereof.

The invention claimed is:

1. An apparatus for performing a logic function on a plurality of inputs to generate an output, comprising:
  a respective switching device that receives a respective input for each of a first subset of the inputs to set the output to a first output logical state if the respective input is a first input logical state; and
  an enable unit that receives a second subset of the inputs to set the output to the first output logical state if any input of the second subset is the first input logical state without dependency on any clock signal,
  wherein the enable unit is connected directly to an output line having the output generated thereon.

2. The apparatus of claim 1, wherein the enable unit determines a logical state of the output from the second subset of inputs when every input of the first subset is a second input logical state.

3. An apparatus for performing a logic function on a plurality of inputs to generate an output, comprising:
  a respective switching device that receives a respective input for each of a first subset of the inputs to set the output to a first output logical state if the respective input is a first input logical state; and
  an enable unit that receives a second subset of the inputs to set the output to the first output logical state if any input of the second subset is the first input logical state;
  wherein the enable unit determines a logical state of the output from the second subset of inputs when every input of the first subset is a second input logical state;
  and wherein the enable unit is an enable circuit including:
  a first switching device that turns on to couple a first voltage source to an output line for setting the output to the first output logical state;
  a second switching device that turns on to couple a second voltage source to the output line for setting the output to the second output logical state; and
  at least one logic gate for determining which of the first and second switches to turn on from the second subset of the inputs.

4. The apparatus of claim 1, wherein the first subset and the second subset are mutually exclusive sets of the inputs.

5. The apparatus of claim 4, wherein the first subset and the second subset comprise all of the inputs.

6. The apparatus of claim 5, wherein the second subset consists of just one of the inputs that is not part of the first subset.

7. The apparatus of claim 1, wherein each respective switching device is a MOSFET with a gate coupled to the respective input.

8. The apparatus of claim 1, wherein the logic function is an OR function.

9. The apparatus of claim 8, wherein the output is generated at an output line of a dynamic PLA (programmable logic array).

10. The apparatus of claim 9, wherein each of the inputs is a respective product term from a corresponding product term line of the dynamic PLA.

11. The apparatus of claim 10, wherein each product term line is pre-charged to set the output to the first output logical state during a pre-charge time of an AND-plane clock signal.

12. The apparatus of claim 11, wherein the enable unit and each respective switching device determine a logical state of the output from the inputs during an evaluation time of the AND-plane clock signal.

13. The apparatus of claim 9, wherein the output line is not pre-charged with an OR-plane clock signal.

14. The apparatus of claim 9, wherein the output line is not coupled to any OR-plane clock signal.

15. An apparatus for performing a logic function on a plurality of inputs to generate an output, comprising:
  a respective switching device that receives a respective input for each of a first subset of the inputs to set a first pre-output on a first pre-output line to a first output logical state if the respective input is a first input logical state;
  a first enable unit that receives a second subset of the inputs to set the first pre-output to the first output logical state if any input of the second subset is the first input logical state;
  a respective switching device that receives a respective input for each of a third subset of the inputs to set a second pre-output on a second pre-output line to the first output logical state if the respective input is the first input logical state;
  a second enable unit that receives a fourth subset of the inputs to set the second pre-output to the first output logical state if any input of the fourth subset is the first input logical state; and
  a logic unit for combining the first and second pre-outputs to generate the output.

16. The apparatus of claim 15, wherein the first enable unit determines a logical state of the first pre-output from the second subset of inputs when every input of the first subset is a second input logical state, and wherein the second enable unit determines a logical state of the second pre-output from the fourth subset of inputs when every input of the third subset is the second input logical state.

17. The apparatus of claim 15, wherein the first, second, third, and fourth subsets are mutually exclusive sets of the inputs, and wherein the first, second, third, and fourth subsets comprise all of the inputs,
  and wherein the second subset consists of just one of the inputs that is not part of the first, third, and fourth subsets, and wherein the fourth subset consists of just one of the inputs that is not part of the first, second, and third subsets.

18. The apparatus of claim 15, wherein the output is generated at an output line of a dynamic PLA (programmable logic array), and wherein each of the inputs is a respective product term from a corresponding product term line of the dynamic PLA.

19. A dynamic PLA comprising:
  an AND-plane of a plurality of product term lines for providing a plurality of product terms; and
  an OR plane of at least one output line, each providing an output as an OR-function of respective product terms from the AND-plane, and each including:
    a respective switching device that receives a respective product term for each of a first subset of the product terms to set the output to a first output logical state if the respective product term is a first input logical state; and
    a respective enable unit that receives a second subset of the product terms to set the output to the first output logical state if any product term of the second subset is the first logical state,
  wherein the respective enable unit is connected directly to the output line having the output generated thereon.

20. The dynamic PLA of claim 19, wherein the AND-plane receives a clock signal for providing the product terms on the product term lines during an evaluation time of the clock signal after the product term lines are pre-charged during a pre-charge time of the clock signal.

21. The dynamic PLA of claim 20, wherein the OR-plane provides the OR-function of the product terms during the evaluation time without pre-charging the output line.

22. The dynamic PLA of claim 19, wherein the respective enable unit determines a logical state of the output line from the second subset of product terms when every product term of the first subset is a second input logical state.

23. The dynamic PLA of claim 22, wherein the respective enable unit is an enable circuit including:
  a first switching device that turns on to couple a first voltage source to the output line for setting the output to the first output logical state;
  a second switching device that turns on to couple a second voltage source to the output line for setting the output to the second output logical state; and
  at least one logic gate for determining which of the first and second switches to turn on from the second subset of product terms.

24. The dynamic PLA of claim 19, wherein the respective enable unit for each output line receives a different respective selected one of the product terms.

25. The dynamic PLA of claim 24, wherein the respective selected one of the product terms received by the respective enable unit is not coupled to any of the respective switching device, for each of the output lines.

* * * * *